US012677616B2

(12) United States Patent
Yamazaki

(10) Patent No.: US 12,677,616 B2
(45) Date of Patent: Jul. 7, 2026

(54) SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

(71) Applicant: Kokusai Electric Corporation, Tokyo (JP)

(72) Inventor: Hirohisa Yamazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 212 days.

(21) Appl. No.: 18/471,239

(22) Filed: Sep. 20, 2023

(65) Prior Publication Data

US 2024/0105461 A1      Mar. 28, 2024

(30) Foreign Application Priority Data

Sep. 22, 2022      (JP) ................................. 2022-151943

(51) Int. Cl.
H10P 50/28      (2026.01)
H10P 72/00      (2026.01)
(52) U.S. Cl.
CPC .......... H10P 50/283 (2026.01); H10P 50/285 (2026.01); H10P 72/0421 (2026.01)
(58) Field of Classification Search
None
See application file for complete search history.

(56) References Cited

U.S. PATENT DOCUMENTS

| | | | | |
|---|---|---|---|---|
| 10,256,108 | B2 * | 4/2019 | Fischer | .............. H01L 21/30655 |
| 11,001,923 | B2 * | 5/2021 | Isobe | ................... C23C 16/4404 |
| 2005/0045092 | A1 * | 3/2005 | Wu | ...................... H01L 21/0228 |
| | | | | 117/103 |
| 2016/0071722 | A1 | 3/2016 | Miura et al. | |

(Continued)

FOREIGN PATENT DOCUMENTS

| | | |
|---|---|---|
| JP | 2016058548 A | 4/2016 |
| JP | 2018-026566 A | 2/2018 |

(Continued)

OTHER PUBLICATIONS

Extended European Search Report issued on Feb. 19, 2024 for European Patent Application No. 23198856.9.

(Continued)

*Primary Examiner* — Shamim Ahmed
(74) *Attorney, Agent, or Firm* — Volpe Koenig

(57)      ABSTRACT

According to the present disclosure, there is provided a technique capable of improving device characteristics. According to some embodiments of the present disclosure, there is provided a technique that includes: (A) processing a substrate by performing a first cycle a first predetermined number of times, wherein the first cycle includes: (a) supplying a first halogen element-containing gas to the substrate; and (b) supplying a second halogen element-containing gas to the substrate; and (B) processing the substrate by performing a second cycle a second predetermined number of times, wherein the second cycle includes: (c) supplying a modification gas to the substrate; and (d) supplying a third halogen element-containing gas to the substrate.

18 Claims, 7 Drawing Sheets

(56)  References Cited

U.S. PATENT DOCUMENTS

| | | | |
|---|---|---|---|
| 2017/0256416 A1 | 9/2017 | Fischer et al. | |
| 2018/0047577 A1* | 2/2018 | Clark ................ | H01L 21/31122 |
| 2021/0305058 A1 | 9/2021 | Ogawa et al. | |
| 2022/0037163 A1 | 2/2022 | Yang et al. | |
| 2022/0119962 A1* | 4/2022 | Blomberg ........... | H01J 37/3244 |
| 2023/0274939 A1* | 8/2023 | Lill ................... | H01L 21/31122 |
| | | | 438/711 |
| 2023/0420267 A1* | 12/2023 | Oyola-Reynoso ........................... | |
| | | | H01L 21/32139 |
| 2025/0125155 A1* | 4/2025 | Fischer ............. | H01L 21/67161 |

FOREIGN PATENT DOCUMENTS

| | | |
|---|---|---|
| JP | 2021-158142 A | 10/2021 |
| JP | 2022-043274 A | 3/2022 |
| KR | 20210119898 A | 10/2021 |
| WO | 2022/051113 A1 | 3/2022 |

OTHER PUBLICATIONS

Korean Office Action issued on Jun. 9, 2025 for Korean Patent Application No. 10-2023-0125424.

* cited by examiner

Figure 4:
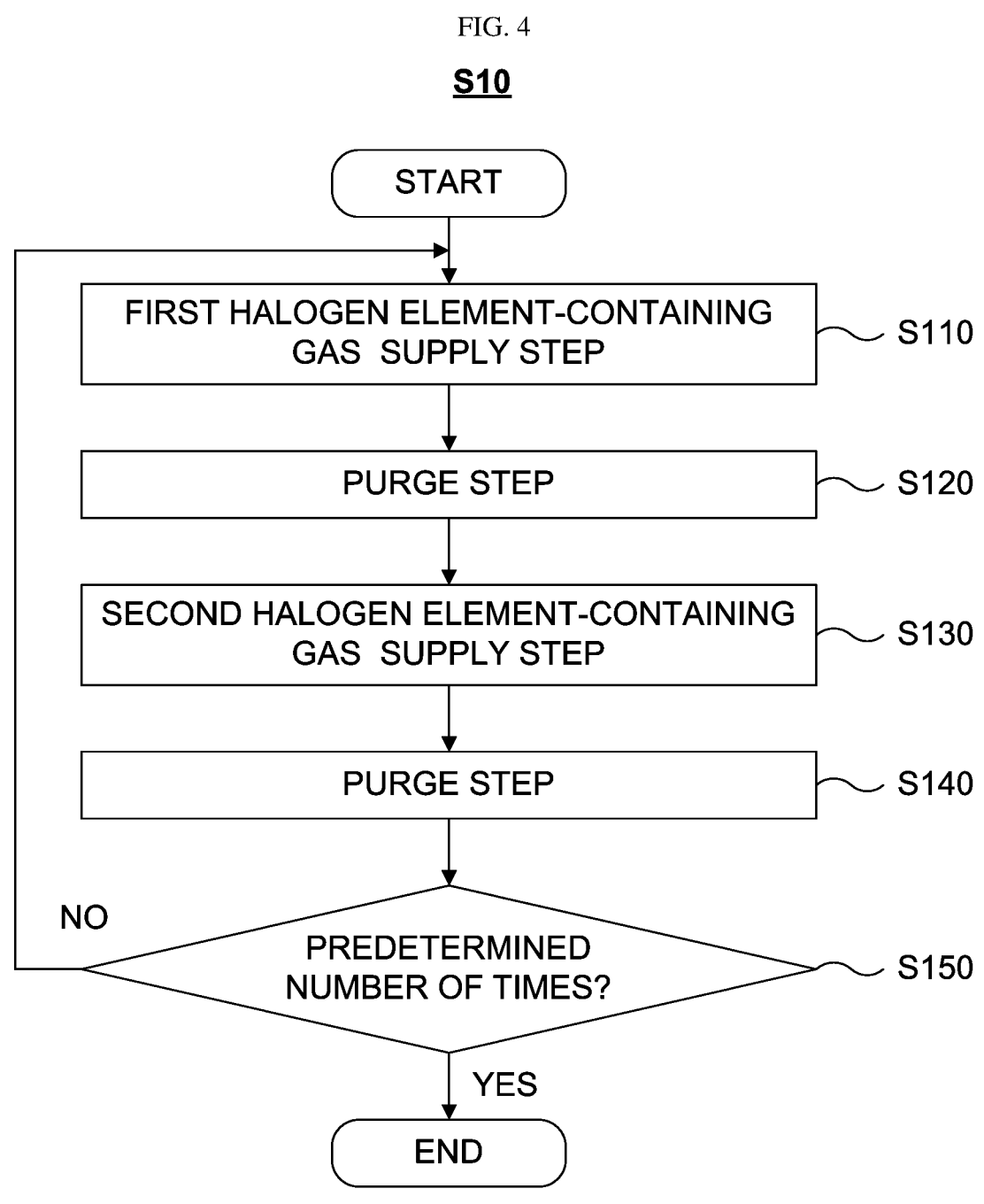

```
              ┌──────────────┐
              │    START     │
              └──────┬───────┘
                     │
    ┌───────────────▼────────────────────────┐
    │  FIRST HALOGEN ELEMENT-CONTAINING       │ ～ S110
    │         GAS  SUPPLY STEP                 │
    └───────────────┬────────────────────────┘
                    │
    ┌───────────────▼────────────────────────┐
    │            PURGE STEP                    │ ～ S120
    └───────────────┬────────────────────────┘
                    │
    ┌───────────────▼────────────────────────┐
    │  SECOND HALOGEN ELEMENT-CONTAINING      │ ～ S130
    │         GAS  SUPPLY STEP                 │
    └───────────────┬────────────────────────┘
                    │
    ┌───────────────▼────────────────────────┐
    │            PURGE STEP                    │ ～ S140
    └───────────────┬────────────────────────┘
                    │
              ┌─────▼──────┐
    NO       PREDETERMINED            ～ S150
   ◄─────  NUMBER OF TIMES?
              └─────┬──────┘
                    │ YES
              ┌─────▼──────┐
              │    END     │
              └────────────┘
```

Figure 5:
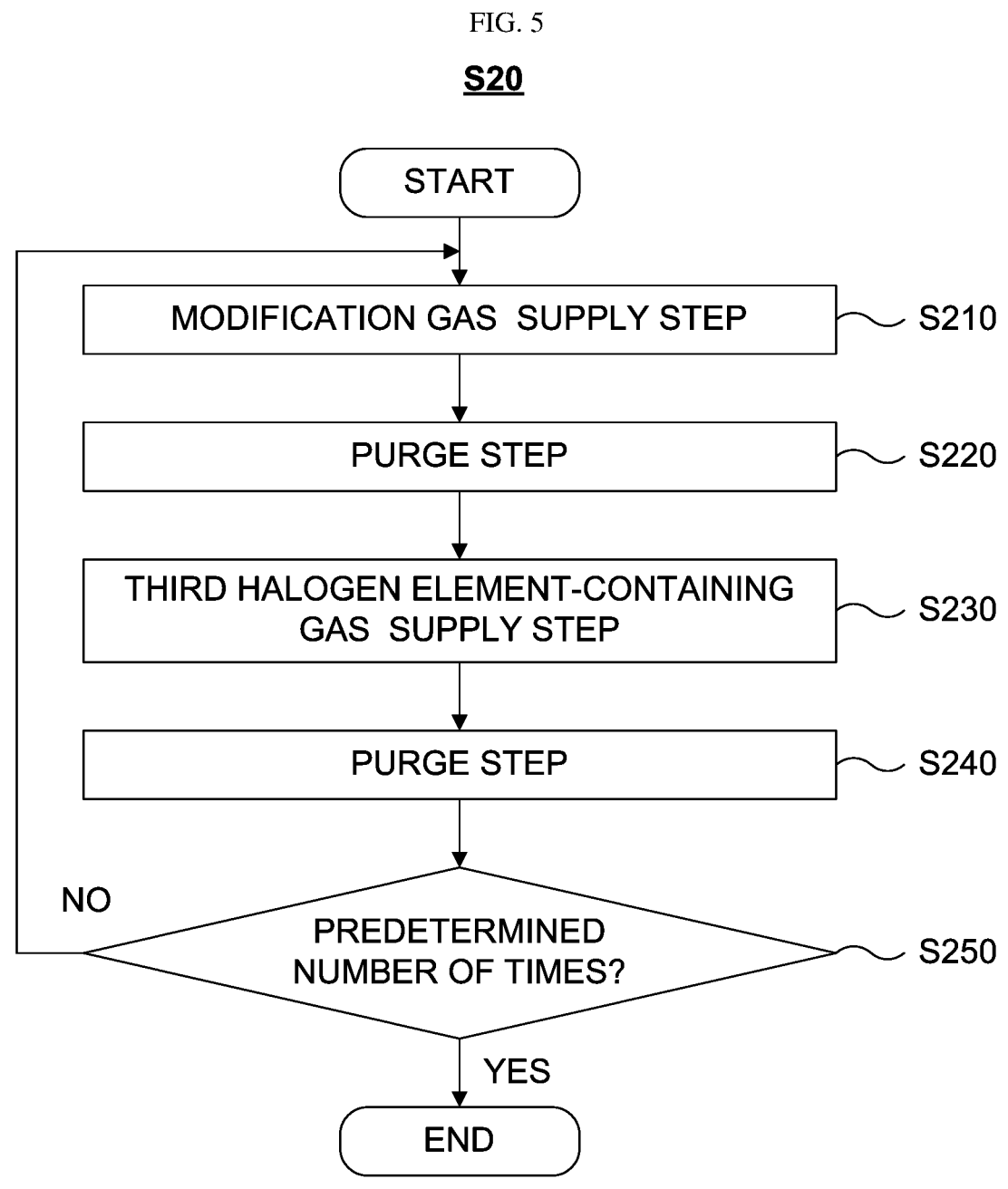

```
                    ┌─────────────┐
                    │    START    │
                    └─────────────┘
                           │
      ┌────────────────────▼─────────────────────┐
 ┌───►│   MODIFICATION GAS  SUPPLY STEP           │ ～ S210
 │    └────────────────────┬─────────────────────┘
 │                         │
 │    ┌────────────────────▼─────────────────────┐
 │    │              PURGE STEP                   │ ～ S220
 │    └────────────────────┬─────────────────────┘
 │                         │
 │    ┌────────────────────▼─────────────────────┐
 │    │   THIRD HALOGEN ELEMENT-CONTAINING        │ ～ S230
 │    │           GAS  SUPPLY STEP                │
 │    └────────────────────┬─────────────────────┘
 │                         │
 │    ┌────────────────────▼─────────────────────┐
 │    │              PURGE STEP                   │ ～ S240
 │    └────────────────────┬─────────────────────┘
 │                         │
 │  NO          ◄──────────▼──────────►
 └──────────────  PREDETERMINED                   ～ S250
                  NUMBER OF TIMES?
                           │
                          YES
                    ┌─────────────┐
                    │     END     │
                    └─────────────┘
```

S30

S40

SUBSTRATE PROCESSING METHOD, METHOD OF MANUFACTURING SEMICONDUCTOR DEVICE, NON-TRANSITORY COMPUTER-READABLE RECORDING MEDIUM AND SUBSTRATE PROCESSING APPARATUS

CROSS-REFERENCE TO RELATED PATENT APPLICATION

This non-provisional U.S. patent application is based on and claims priority under 35 U.S.C. § 119 of Japanese Patent Application No. 2022-151943, filed on Sep. 22, 2022, in the Japanese Patent Office, the entire contents of which are hereby incorporated by reference.

BACKGROUND

1. Field

The present disclosure relates to a substrate processing method, a method of manufacturing a semiconductor device, a non-transitory computer-readable recording medium and a substrate processing apparatus.

2. Related Art

According to some related arts, as a part of a manufacturing process of a semiconductor device, an etching step of etching a film may be performed. According to the etching step, by performing a step of supplying a boron-containing gas and a step of supplying a halide gas a predetermined number of times, it is possible to etch the film.

When etching the film as described above, a halogen element may remain in the film. Thereby, device characteristics may deteriorate.

SUMMARY

According to the present disclosure, there is provided a technique capable of improving device characteristics.

According to some embodiments of the present disclosure, there is provided a technique that includes: (A) processing a substrate by performing a first cycle a first predetermined number of times, wherein the first cycle includes: (a) supplying a first halogen element-containing gas to the substrate; and (b) supplying a second halogen element-containing gas to the substrate; and (B) processing the substrate by performing a second cycle a second predetermined number of times, wherein the second cycle includes: (c) supplying a modification gas to the substrate; and (d) supplying a third halogen element-containing gas to the substrate.

BRIEF DESCRIPTION OF THE DRAWINGS

FIG. 4 is a flow chart schematically illustrating an atomic layer etching step according to the first embodiment of the present disclosure.

FIG. 5 is a flow chart schematically illustrating a residual first halogen element removing step according to the first embodiment of the present disclosure.

DETAILED DESCRIPTION

First Embodiment of Present Disclosure

Figure 1:
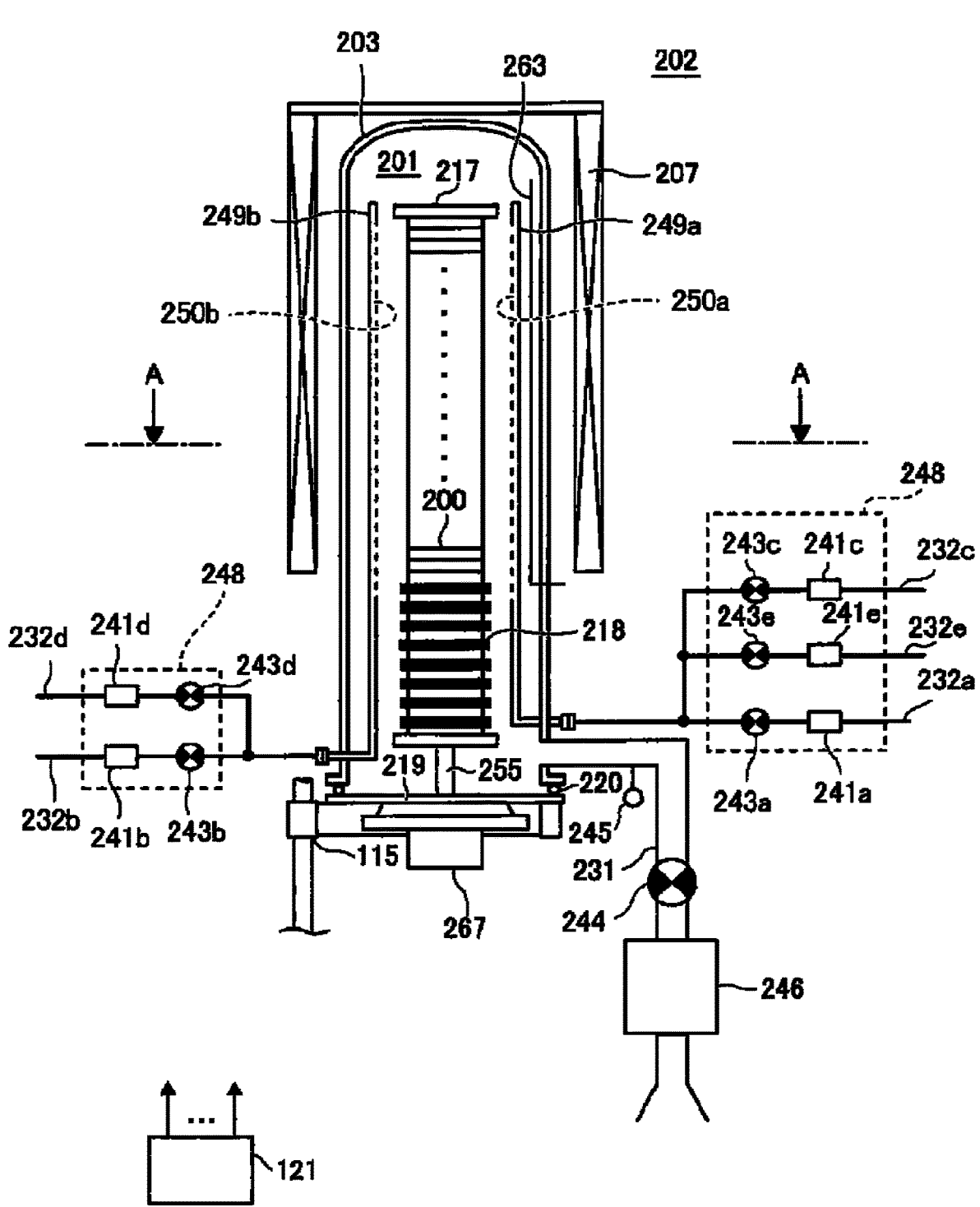
FIG. 1 is a diagram schematically illustrating a vertical cross-section of a vertical type process furnace of a substrate processing apparatus preferably used in a first embodiment of the present disclosure.

Hereinafter, a first embodiment of the technique of the present disclosure will be described in detail mainly with reference to FIGS. 1 through 5. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

(1) Configuration of Substrate Processing Apparatus

As shown in FIG. 1, a substrate processing apparatus according to the present embodiment includes a process furnace 202 such as a vertical type process furnace. The process furnace 202 includes a heater 207 serving as a heating structure (which is a heating system, a temperature regulator or a temperature adjusting structure). The heater 207 is of a cylindrical shape, and is vertically installed while being supported by a support plate (not shown). The heater 207 also functions as an activator (also referred to as an "exciter") capable of activating (or exciting) a gas by a heat.

A reaction tube 203 is provided in an inner side of the heater 207 to be aligned in a manner concentric with the heater 207. For example, the reaction tube 203 is made of a heat resistant material such as quartz ($SiO_2$) and silicon carbide (SiC). For example, the reaction tube 203 is of a cylindrical shape with a closed upper end and an open lower end. A process chamber 201 is provided in a hollow cylindrical portion of the reaction tube 203. The process chamber 201 is configured to be capable of accommodating a plurality of wafers including a wafer 200 serving as a substrate. Hereinafter, the plurality of wafers including the wafer 200 may also be simply referred to as "wafers 200". The wafer 200 is processed in the process chamber 201.

Nozzles 249a and 249b are provided in the process chamber 201 so as to penetrate a lower side wall of the reaction tube 203. Gas supply pipes 232a and 232b are connected to the nozzles 249a and 249b, respectively.

Mass flow controllers (also simply referred to as "MFCs") 241a and 241b serving as flow rate controllers (flow rate control structures) and valves 243a and 243b serving as opening/closing valves are sequentially installed at the gas supply pipes 232a and 232b, respectively, in this order from upstream sides to downstream sides of the gas supply pipes 232a and 232b in a gas flow direction. Gas supply pipes 232c and 232e are connected to the gas supply pipe 232a at a downstream side of the valve 243*a* of the gas supply pipe 232*a*. A gas supply pipe 232*d* is connected to the gas supply pipe 232*b* at a downstream side of the valve 243*b* of the gas supply pipe 232*b*. MFCs 241*c*, 241*d* and valves 243*c*, 243*d* and 243*e* are sequentially installed at the gas supply pipes 232*c*, 232*d* and 232*e*, respectively, in this order from upstream sides to downstream sides of the gas supply pipes 232*c*, 232*d* and 232*e* in the gas flow direction.

Figure 2:
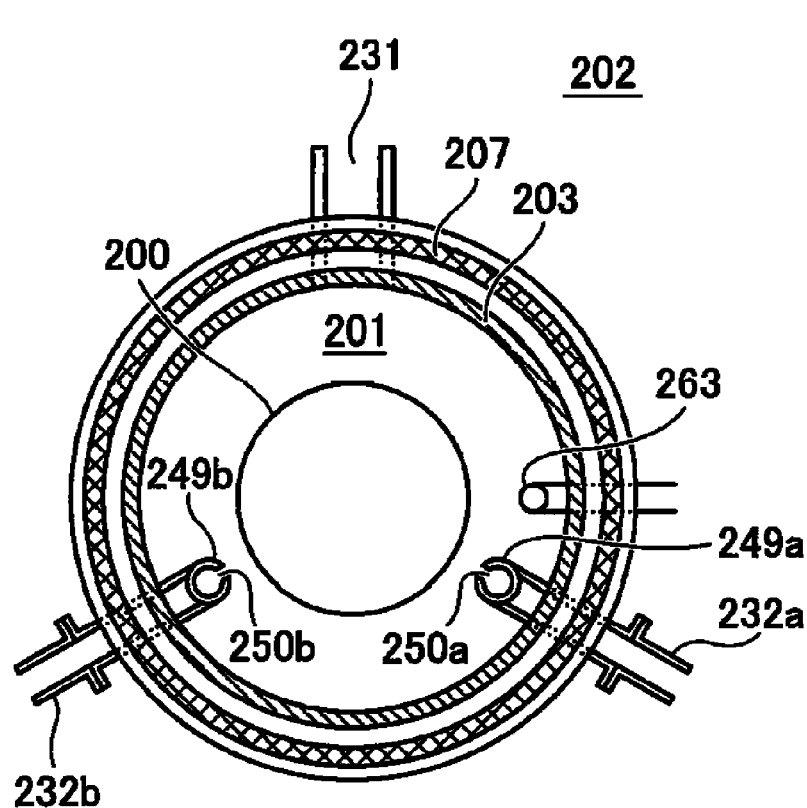
FIG. 2 is a diagram schematically illustrating a horizontal cross-section, taken along a line A-A shown in FIG. 1, of the vertical type process furnace of the substrate processing apparatus preferably used in the first embodiment of the present disclosure.

As shown in FIGS. 1 and 2, each of the nozzles 249*a* and 249*b* is installed in an annular space provided between an inner wall of the reaction tube 203 and the wafers 200 when viewed from above, and extends upward from a lower portion toward an upper portion of the reaction tube 203 along the inner wall of the reaction tube 203 (that is, extends upward along a wafer arrangement direction). That is, each of the nozzles 249*a* and 249*b* is installed in a region that is located beside and horizontally surrounds a wafer arrangement region in which the wafers 200 are arranged (stacked) along the wafer arrangement direction. A plurality of gas supply holes 250*a* and a plurality of gas supply holes 250*b* are provided at side surfaces of the nozzles 249*a* and 249*b*, respectively. The gas supply holes 250*a* and the gas supply holes 250*b* are open toward a center of the reaction tube 203, and are configured such that gases are capable of being supplied toward the wafers 200 via the gas supply holes 250*a* and the gas supply holes 250*b*. The gas supply holes 250*a* and the gas supply holes 250*b* are provided from the lower portion toward the upper portion of the reaction tube 203.

A gas containing a first halogen element (hereinafter, also referred to as a "first halogen element-containing gas") is supplied into the process chamber 201 through the gas supply pipe 232*a* provided with the MFC 241*a* and the valve 243*a* and the nozzle 249*a*.

A gas containing a second halogen element different from the first halogen element (hereinafter, also referred to as a "second halogen element-containing gas") is supplied into the process chamber 201 through the gas supply pipe 232*b* provided with the MFC 241*b* and the valve 243*b* and the nozzle 249*b*.

An inert gas is supplied into the process chamber 201 through the gas supply pipes 232*c* and 232*d* provided with the MFCs 241*c* and 241*d* and the valves 243*c* and 243*d*, respectively, the gas supply pipes 232*a* and 232*b* and the nozzles 249*a* and 249*b*. The inert gas acts as a purge gas, a carrier gas, a dilution gas and the like.

A modification gas is supplied into the process chamber 201 through the gas supply pipe 232*e* provided with the MFC 241*e* and the valve 243*e* and the nozzle 249*a*.

A first halogen element-containing gas supplier (which is a first halogen element-containing gas supply structure or a first halogen element-containing gas supply system) is constituted mainly by the gas supply pipe 232*a*, the MFC 241*a* and the valve 243*a*. A second halogen element-containing gas supplier (which is a second halogen element-containing gas supply structure or a second halogen element-containing gas supply system) is constituted mainly by the gas supply pipe 232*b*, the MFC 241*b* and the valve 243*b*. An inert gas supplier (which is an inert gas supply structure or an inert gas supply system) is constituted mainly by the gas supply pipes 232*c* and 232*d*, the MFCs 241*c* and 241*d* and the valves 243*c* and 243*d*. A modification gas supplier (which is a modification gas supply structure or a modification gas supply system) is constituted mainly by the gas supply pipe 232*e*, the MFC 241*e* and the valve 243*e*. When the second halogen element-containing gas is used as a gas containing a third halogen element described later (hereinafter, also referred to as a "third halogen element-containing gas"), the second halogen element-containing gas supplier may also be referred to as a "third halogen element-containing gas supplier (which is a third halogen element-containing gas supply structure or a third halogen element-containing gas supply system).

Any one or an entirety of the gas suppliers described above may be embodied as an integrated gas supply system 248 in which the components such as the valves 243*a* through 243*e* and the MFCs 241*a* through 241*e* are integrated. The integrated gas supply system 248 is connected to the respective gas supply pipes 232*a* through 232*e*. An operation of the integrated gas supply system 248 to supply various gases to the gas supply pipes 232*a* through 232*e*, for example, operations such as an operation of opening and closing the valves 243*a* through 243*e* and an operation of adjusting flow rates of the gases through the MFCs 241*a* through 241*e* may be controlled by a controller 121 which will be described later. The integrated gas supply system 248 may be embodied as an integrated structure (integrated unit) of an all-in-one type or a divided type. The integrated gas supply system 248 may be attached to or detached from the components such as the gas supply pipes 232*a* through 232*e* on a basis of the integrated structure. Operations such as maintenance, replacement and addition for the integrated gas supply system 248 may be performed on a basis of the integrated structure.

An exhaust pipe 231 through which an inner atmosphere of the process chamber 201 is exhausted is connected to the lower side wall of the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection structure) to detect an inner pressure of the process chamber 201, and the APC valve 244 serves as a pressure regulator (pressure adjusting structure). With the vacuum pump 246 in operation, the APC valve 244 may be opened or closed to perform a vacuum exhaust operation of the process chamber 201 or stop the vacuum exhaust operation. With the vacuum pump 246 in operation, the inner pressure of the process chamber 201 may be adjusted by adjusting an opening degree of the APC valve 244 based on pressure information detected by the pressure sensor 245. An exhauster (which is an exhaust structure or an exhaust system) is constituted mainly by the exhaust pipe 231, the pressure sensor 245 and the APC valve 244. The exhauster may further include the vacuum pump 246.

A seal cap 219 serving as a furnace opening lid capable of airtightly sealing (or closing) a lower end opening of the reaction tube 203 is provided under the reaction tube 203. For example, the seal cap 219 is made of a metal material such as SUS, and is of a disk shape. An O-ring 220 serving as a seal is provided on an upper surface of the seal cap 219 so as to be in contact with the lower end of the reaction tube 203. A rotator 267 configured to rotate a boat 217 described later is provided under the seal cap 219. A rotating shaft 255 of the rotator 267 is connected to the boat 217 through the seal cap 219. As the rotator 267 rotates the boat 217, the wafers 200 accommodated in the boat 217 are rotated. The seal cap 219 is elevated or lowered in a vertical direction by a boat elevator 115 serving as an elevating structure provided outside the reaction tube 203. The boat elevator 115 serves as a transfer device (which is a transfer structure or a transfer system) capable of transferring (loading) the wafers 200 into the process chamber 201 and capable of transferring (unloading) the wafers 200 out of the process chamber 201 by elevating and lowering the seal cap 219.

The boat 217 (which is a substrate support or a substrate retainer) is configured such that the wafers 200 (for example, 25 wafers to 200 wafers) are accommodated (or supported) in the vertical direction in the boat 217 while the wafers 200 are horizontally oriented with their centers aligned with one another in a multistage manner. That is, the wafers 200 are arranged with a predetermined interval therebetween. For example, the boat 217 is made of a heat resistant material such as quartz and SiC. For example, a plurality of heat insulation plates 218 made of a heat resistant material such as quartz and SiC are supported at a lower portion of the boat 217 in a multistage manner.

A temperature sensor 263 serving as a temperature detector is installed in the reaction tube 203. A state of electric conduction to the heater 207 is adjusted based on temperature information detected by the temperature sensor 263 such that a desired temperature distribution of an inner temperature of the process chamber 201 can be obtained. The temperature sensor 263 is provided along the inner wall of the reaction tube 203.

Figure 3:
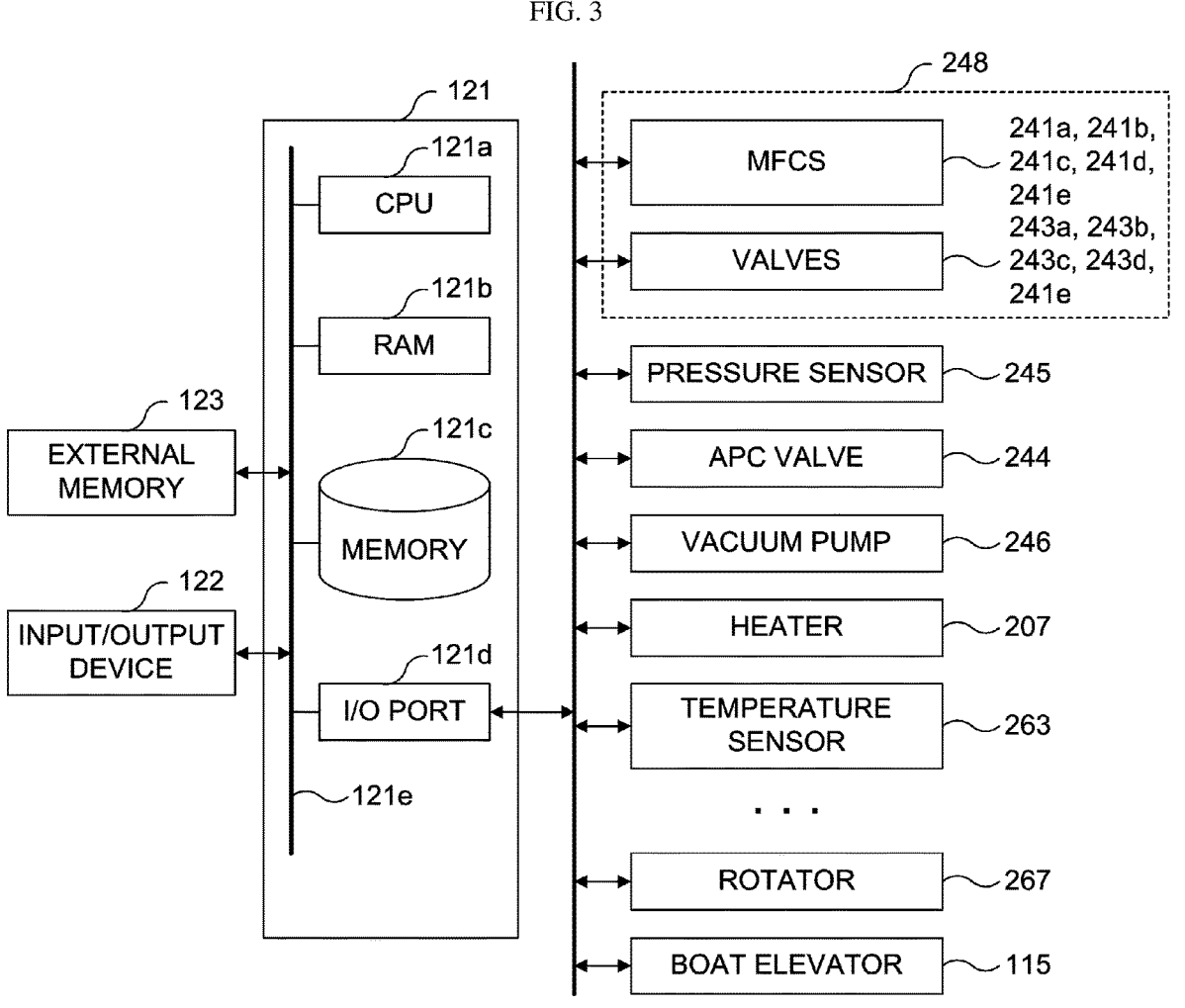
FIG. 3 is a block diagram schematically illustrating a configuration of a controller and related components of the substrate processing apparatus preferably used in the first embodiment of the present disclosure.

As shown in FIG. 3, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 constituted by a component such as a touch panel is connected to the controller 121.

The memory 121c is configured by a component such as a flash memory and a hard disk drive (HDD). For example, a control program configured to control an operation of the substrate processing apparatus and a process recipe containing information on sequences and conditions of a substrate processing such as an etching process described later may be readably stored in the memory 121c. The process recipe is obtained by combining steps (sequences or processes) of the etching process described later such that the controller 121 can execute the steps to acquire a predetermined result, and functions as a program. Hereinafter, the process recipe and the control program may be collectively or individually referred to as a "program". In addition, the process recipe may also be simply referred to as a "recipe". Thus, in the present specification, the term "program" may refer to the recipe alone, may refer to the control program alone or may refer to both of the recipe and the control program. The RAM 121b functions as a memory area (work area) where a program or data read by the CPU 121a is temporarily stored.

The I/O port 121d is connected to the components described above such as the MFCs 241a through 241e, the valves 243a through 243e, the pressure sensor 245, the APC valve 244, the vacuum pump 246, the temperature sensor 263, the heater 207, the rotator 267 and the boat elevator 115.

The CPU 121a is configured to read the control program from the memory 121c and execute the read control program. In addition, the CPU 121a is configured to read the recipe from the memory 121c, for example, in accordance with an operation command inputted from the input/output device 122. In accordance with the contents of the read recipe, the CPU 121a may be configured to be capable of controlling various operations such as flow rate adjusting operations for various gases by the MFCs 241a through 241e, opening and closing operations of the valves 243a through 243e, an opening and closing operation of the APC valve 244, a pressure regulating operation (pressure adjusting operation) by the APC valve 244 based on the pressure sensor 245, a start and stop operation of the vacuum pump 246, a temperature adjusting operation by the heater 207 based on the temperature sensor 263, an operation of adjusting a rotation and a rotation speed of the boat 217 by the rotator 267 and an elevating and lowering operation of the boat 217 by the boat elevator 115.

The controller 121 may be embodied by installing the above-described program stored in an external memory 123 into the computer. For example, the external memory 123 may include a magnetic disk such as a hard disk drive (HDD), an optical disk such as a CD, a magneto-optical disk such as an MO and a semiconductor memory such as a USB memory. The memory 121c or the external memory 123 may be embodied by a non-transitory computer readable recording medium. Hereafter, the memory 121c and the external memory 123 may be collectively or individually referred to as a "recording medium". Thus, in the present specification, the term "recording medium" may refer to the memory 121c alone, may refer to the external memory 123 alone or may refer to both of the memory 121c and the external memory 123. Instead of the external memory 123, a communication interface such as the Internet and a dedicated line may be used for providing the program to the computer.

(2) Substrate Processing

Hereinafter, an example of the substrate processing such as the etching process of etching an oxide film formed on a surface of the wafer 200 by performing an atomic layer etching step and a residual first halogen element removing step will be described mainly with reference to FIGS. 4 and 5. The substrate processing serves as a part of a manufacturing process of a semiconductor device, and is performed by using the process furnace 202 of the substrate processing apparatus described above. In the following descriptions, the operations of components constituting the substrate processing apparatus are controlled by the controller 121.

In the present specification, the term "wafer" may refer to "a wafer itself", or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself", or may refer to "a surface of a predetermined layer (or a predetermined film) formed on a wafer". Thus, in the present specification, "forming a predetermined layer (or a film) on a wafer" may refer to "forming a predetermined layer (or a film) directly on a surface of a wafer itself", or may refer to "forming a predetermined layer (or a film) on a surface of another layer (or another film) formed on a wafer". In the present specification, the terms "substrate" and "wafer" may be used as substantially the same meaning.

(2-1) Atomic Layer Etching Step (Step S10)

<Wafer Charging Step and Boat Loading Step>

The wafers 200 on which the oxide film to be etched is formed are charged (transferred) into the boat 217 (wafer charging step). Thereafter, the boat 217 supporting the wafers 200 is elevated by the boat elevator 115 and loaded (transferred) into the process chamber 201 (boat loading step). With the boat 217 loaded, the seal cap 219 airtightly seals the lower end of the reaction tube 203 via the O-ring 220.

<Pressure Adjusting Step and Temperature Adjusting Step>

The vacuum pump 246 vacuum-exhausts (decompresses and exhausts) the inner atmosphere of the process chamber 201 (that is, a space in which the wafers 200 are accommodated) such that the inner pressure of the process chamber 201 reaches and is maintained at a desired process pressure (vacuum degree) (pressure adjusting step). In addition, the heater 207 heats the process chamber 201 such that a temperature of the wafer 200 in the process chamber 201 reaches and is maintained at a desired process temperature (temperature adjusting step). In addition, a rotation of the wafer 200 is started by the rotator 267. The vacuum pump 246 continuously vacuum-exhausts the inner atmosphere of the process chamber 201, the heater 207 continuously heats the wafer 200 in the process chamber 201 and the rotator 267 continuously rotates the wafer 200 until at least a processing of the wafer 200 is completed.

For example, in the present specification, the "process temperature" refers to the temperature of the wafer 200 or the inner temperature of the process chamber 201, and the "process pressure" refers to the inner pressure of the process chamber 201. In addition, a "process time" refers to a time duration of continuously performing a process related thereto. The same also applies to the following description.

Thereafter, the following steps S110, S120, S130, S140 and S150 are performed on the oxide film formed on the wafer 200.

According to the present embodiment, as the oxide film to be etched, for example, a metal oxide film (an oxide film containing a metal element) such as an aluminum oxide ($Al_2O_3$) film, a zirconium oxide ($ZrO_2$) film, a hafnium oxide ($HfO_2$) film, a silicon oxide ($SiO_2$) film, a titanium oxide ($TiO_2$) film, a yttrium oxide ($Y_2O_3$) film, a lanthanum oxide $La_2O_3$) film, a tantalum oxide ($Ta_2O_5$) film, a niobium oxide ($Nb_2O_5$, $Nb_2O_3$, NbO) film, a ruthenium oxide ($RuO_2$, RuO) film, a vanadium oxide ($V_2O_5$) film, a zinc oxide (ZnO) film, a manganese oxide (MnO, $Mn_2O_3$) film and a cobalt oxide (CoO) film may be used. As the oxide film to be etched, for example, one or more of the films exemplified above as the metal oxide film may be used.

<First Halogen Element-Containing Gas Supply Step: Step S110>

In the present step, the first halogen element-containing gas is supplied to the wafer 200 in the process chamber 201. Specifically, the valve 243a is opened such that the first halogen element-containing gas is supplied into the gas supply pipe 232a. A flow rate of the first halogen element-containing gas supplied into the gas supply pipe 232a is adjusted by the MFC 241a. Then, the first halogen element-containing gas whose flow rate is adjusted is supplied into the process chamber 201 through the nozzle 249a, and is exhausted through the exhaust pipe 231. In the present step, simultaneously with a supply of the first halogen element-containing gas, the valves 243c and 243d are opened such that the inert gas is supplied into the gas supply pipes 232c and 232d.

As the first halogen element-containing gas, for example, a fluorine-containing gas containing fluorine (F) as the first halogen element may be used. As the fluorine-containing gas, for example, a gas such as fluorine ($F_2$) gas, nitrogen trifluoride ($NF_3$) gas, hydrogen fluoride (HF) gas, carbon tetrafluoride ($CF_4$) gas and tungsten hexafluoride ($WF_6$) gas may be used. As the first halogen element-containing gas, for example, one or more of the gases exemplified above as the fluorine-containing gas may be used. Further, as the first halogen element-containing gas, for example, a hydrogen compound may be used. As the hydrogen compound, for example, HF gas may be used. As the first halogen element-containing gas, for example, one or more of the gases exemplified above as the fluorine-containing gas and the hydrogen compound may be used.

As the inert gas, for example, nitrogen ($N_2$) gas or a rare gas such as argon (Ar) gas, helium (He) gas, neon (Ne) gas and xenon (Xe) gas may be used. As the inert gas, for example, one or more of the gases exemplified above as the inert may be used.

Specifically, for example, when the $Al_2O_3$ film is used as the film to be etched and the HF gas is used as the first halogen element-containing gas, by supplying the HF gas, the $Al_2O_3$ on the surface of the wafer 200 reacts with the HF. Thereby, a part of aluminum (Al) atoms and a part of oxygen (O) atoms are desorbed from the $Al_2O_3$ and substituted with fluorine (F). As a result, the $Al_2O_3$ is converted to AlOF and $AlF_3$. Further, oxygen desorbed from the $Al_2O_3$ combines with hydrogen (H) to generate water vapor ($H_2O$ gas). Then, the $H_2O$ is desorbed from the surface of the wafer 200 and discharged from the process chamber 201. Thereby, a surface of the $Al_2O_3$ is etched. That is, by supplying the HF gas, the following reaction occurs between the HF gas and the $Al_2O_3$ on the surface of the wafer 200.

$$Al_2O_3 + HF \rightarrow AlF_3 + AlOF + H_2O$$

For example, the process conditions of the present step are as follows:

A supply flow rate of the HF gas: from 0.1 slm to 10 slm;

A supply flow rate of the $N_2$ gas (for each gas supply pipe): from 0 slm to 10 slm;

A supply time (time duration) of each gas: from 0.1 second to 200 seconds, preferably from 5 seconds to 150 seconds;

The process temperature: 200° C. or higher and less than 900° C., preferably from 300° C. to 800° C., more preferably from 300° C. to 450° C.; and The process pressure: from 150 Pa to 400 Pa, preferably from 200 Pa to 300 Pa.

In the present specification, a notation of a numerical range such as "from 0.1 slm to 10 slm" means that a lower limit and an upper limit are included in the numerical range. Therefore, for example, a numerical range "from 0.1 slm to 10 slm" means a range equal to or higher than 0.1 slm and equal to or less than 10 slm. The same also applies to other numerical ranges described in the present specification.

Further, when a supply flow rate of the gas is zero (0) slm, it refers to a case where the gas is not supplied. The same also applies to the following descriptions.

Further, as described above, in the present specification, the process temperature refers to the temperature of the wafer 200 or the inner temperature of the process chamber 201, and the process pressure refers to the inner pressure of the process chamber 201. In addition, the process time refers to the time duration of continuously performing the process related thereto. The same also applies to the following descriptions.

<Purge Step: Step S120>

In the present step, the valve 243a is closed to stop the supply of the first halogen element-containing gas into the process chamber 201. In the present step, with the APC valve 244 of the exhaust pipe 231 open, the vacuum pump 246 vacuum-exhausts the inner atmosphere of the process chamber 201 to remove a substance such as a residual gas remaining on the wafer 200. Thereby, it is possible to remove the first halogen element-containing gas which did not react and reaction by-products remaining in the process chamber 201 out of the process chamber 201. In the present step, by maintaining the valves 243c and 243d open, the inert gas is continuously supplied into the process chamber 201. The inert gas acts as the purge gas in the present step, which improves an efficiency of removing the first halogen element-containing gas which did not react and the reaction by-products remaining in the process chamber 201 out of the process chamber 201 by removing the residual gas remaining on the wafer 200. Specifically, for example, the substance such as the HF gas (which did not react) and the $H_2O$ (which is the reaction by-products) remaining in the process chamber 201 is removed from the process chamber 201.

<Second Halogen Element-Containing Gas Supply Step: Step S130>

Subsequently, the second halogen element-containing gas is supplied to the wafer 200 in the process chamber 201. Specifically, the valve 243b is opened such that the second halogen element-containing gas is supplied into the gas supply pipe 232b. A flow rate of the second halogen element-containing gas supplied into the gas supply pipe 232b is adjusted by the MFC 241b. Then, the second halogen element-containing gas whose flow rate is adjusted is supplied into the process chamber 201 through the nozzle 249b, and is exhausted through the exhaust pipe 231. In the present step, simultaneously with a supply of the second halogen element-containing gas, the valves 243c and 243d are opened such that the inert gas is supplied into the gas supply pipes 232c and 232d.

As the second halogen element-containing gas, for example, a chlorine-containing gas containing chlorine (Cl) as the second halogen element may be used. As the chlorine-containing gas, for example, a gas such as chlorine ($Cl_2$) gas, boron trichloride ($BCl_3$) gas, carbon tetrachloride ($CCl_4$) gas, thionyl chloride ($SOCl_2$) gas, sulfuryl chloride ($SO_2Cl_2$) gas, phosgene ($COCl_2$) gas, phosphorus trichloride ($PCl_3$) gas, phosphorus pentachloride ($PCl_5$) gas may be used. Preferably, as the chlorine-containing gas, a gas containing chlorine (Cl) and oxygen (O) such as the $SOCl_2$ gas and the $COCl_2$ gas may be used. By using the gas containing chlorine and oxygen as the chlorine-containing gas, it is possible to replace oxygen with fluorine (F) and to desorb fluorine from the wafer 200. Further, as the second halogen element-containing gas, for example, a compound of a Group 13 element or a compound of a Group 15 element may be used. As the compound of the Group 13 element, for example, a compound of an element such as boron (B), aluminum (Al), gallium (Ga) and indium (In) may be used. As the compound of the Group 15 element, for example, a compound of an element such as nitrogen (N), phosphorus (P) and arsenic (As) may be used. As the second halogen element-containing gas, for example, one or more of the gases exemplified above as the chlorine-containing gas and the compound of the Group 13 element and the compound of the Group 15 element may be used.

Specifically, for example, when the $BCl_3$ gas is used as the second halogen element-containing gas, by supplying the $BCl_3$ gas, the $AlF_3$ on the surface of the wafer 200 reacts with the $BCl_3$. Thereby, a part of fluorine (F) atoms is desorbed from the $AlF_3$ and substituted with chlorine (Cl). As a result, a molecular layer of the $AlF_3$ formed on the surface of the wafer 200 is converted to $AlCl_xF_y$ (which is volatile) and desorbed from the surface of the wafer 200. Further, fluorine desorbed from the $AlF_3$ combines with boron (B) desorbed from the $BCl_3$ to generate $BF_2$. Then, the $AlCl_xF_y$ and the $BF_3$ are desorbed from the surface of the wafer 200 and discharged from the process chamber 201.

Thereby, the surface of the $Al_2O_3$ is etched. That is, by supplying the $BCl_3$ gas, the following reaction occurs on the surface of the wafer 200.

$$AlF_3 + AlOF + BCl_3 \rightarrow AlCl_3F + BF_2 + AlOF$$

For example, the process conditions of the present step are as follows:

A supply flow rate of the $BCl_3$ gas: from 0.1 slm to 10 slm;

A supply flow rate of the $N_2$ gas (for each gas supply pipe): from 0 slm to 10 slm;

A supply time (time duration) of each gas: from 0.1 second to 300 seconds, preferably from 5 seconds to 200 seconds;

The process temperature: 200° C. or higher and less than 900° C., preferably from 300° C. to 800° C., more preferably from 300° C. to 450° C.; and The process pressure: from 150 Pa to 400 Pa, preferably from 200 Pa to 300 Pa.

<Purge Step: Step S140>

In the present step, the valve 243b is closed to stop the supply of the second halogen element-containing gas into the process chamber 201. In the present step, with the APC valve 244 of the exhaust pipe 231 open, the vacuum pump 246 vacuum-exhausts the inner atmosphere of the process chamber 201 to remove a substance such as a residual gas remaining on the wafer 200. Thereby, it is possible to remove the second halogen element-containing gas which did not react and reaction by-products remaining in the process chamber 201 out of the process chamber 201. In the present step, by maintaining the valves 243c and 243d open, the inert gas is continuously supplied into the process chamber 201. The inert gas acts as the purge gas in the present step, which improves an efficiency of removing the second halogen element-containing gas which did not react and the reaction by-products remaining in the process chamber 201 out of the process chamber 201 by removing the residual gas remaining on the wafer 200. Specifically, for example, the substance such as the $BCl_3$ gas (which did not react) and the $AlCl_3F$ and the $BF_2$ (which are the reaction by-products) remaining in the process chamber 201 is removed from the process chamber 201.

<Performing First Cycle First Predetermined Number of Times: Step S150>

By performing a first cycle wherein the steps S110 through S140 described above are performed a first predetermined number of times (n times, wherein n is an integer equal to or greater than 1), it is possible to process the wafer 200 by etching the wafer 200. That is, in the step S10, the first halogen element-containing gas supply step (step S110) and the second halogen element-containing gas supply step (step S130) are performed. When n is equal to or greater than 2, the first halogen element-containing gas supply step (step S110) and the second halogen element-containing gas supply step (step S130) may be alternately performed.

As described above, when the atomic layer etching step S10 is performed, for example, the volatile reaction by-products such as the $AlCl_3F$ and the $BF_2$ can be desorbed from the surface of the wafer 200. However, the AlOF may remain, and thereby, fluorine (F) may remain on the wafer 200. That is, the first halogen element contained in an etching gas (that is, the first halogen element-containing gas) used in the atomic layer etching step S10 may remain on the wafer 200. When the first halogen element remains on the wafer 200, device characteristics may deteriorate. Therefore, according to the present embodiment, a residual first halogen element removing step S20 of removing a residual first halogen element is performed after the atomic layer etching step S10 described above.

(2-2) Residual First Halogen Element Removing Step (Step S20)

Subsequently, the residual first halogen element removing step S20 will be described in detail with reference to FIG. 5. That is, the following steps S210, S220, S230, S240 and S250 are performed on the wafer 200 etched by using the first halogen element-containing gas. For example, the present step may be applied to a case where the following steps S210 through S250 are performed after the atomic layer etching step S10 in the same process furnace 202 in which the atomic layer etching step S10 described above is performed, or may be applied to a case where the following steps S210 through S250 are performed after the wafer 200 etched by using the first halogen element-containing gas is loaded into another process furnace 202.

<Modification Gas Supply Step: Step S210>

In the present step, the modification gas is supplied to the wafer 200 in the process chamber 201. Specifically, the valve 243e is opened such that the modification gas is supplied into the gas supply pipe 232a. A flow rate of the modification gas is adjusted by the MFC 241e. Then, the modification gas whose flow rate is adjusted is supplied into the process chamber 201 through the nozzle 249a, and is exhausted through the exhaust pipe 231. In the present step, simultaneously with a supply of the modification gas, the valves 243c and 243d are opened such that the inert gas is supplied into the gas supply pipes 232c and 232d.

As the modification gas, for example, an oxygen-containing gas or a hydrogen-containing gas may be used. As the oxygen-containing gas, for example, a gas such as oxygen ($O_2$) gas, ozone ($O_3$) gas, the water vapor ($H_2O$ gas), hydrogen peroxide ($H_2O_2$) gas and an activated $O_2$ gas may be used. Further, as the hydrogen-containing gas, for example, a gas such as hydrogen ($H_2$) gas, deuterium ($D_2$), the $H_2O$ gas, the $H_2O_2$ gas, an activated $H_2$ gas, ammonia ($NH_3$) gas and hydrazine ($N_2H_4$) gas may be used. As the modification gas, for example, one or more of the gases exemplified above as the oxygen-containing gas and the hydrogen-containing gas may be used.

By supplying the modification gas, a bond between the oxide film on the surface of the wafer 200 and the first halogen element is broken (cut), and a volatile gas (which is easily desorbed) containing the first halogen element is generated. Then, the volatile gas is discharged from the process chamber 201.

Specifically, for example, when the $O_3$ gas is used as the modification gas, by supplying the $O_3$ gas to the wafer 200, the AlOF on the surface of the wafer 200 reacts with the $O_3$. Thereby, a fluorine (F) bond of the AlOF is broken (cut). Further, fluorine is desorbed from the AlOF and substituted with oxygen (O). That is, the AlOF formed on the wafer 200 is modified to the $Al_2O_3$ and $F_X$ is desorbed. In other words, the residual fluorine is removed by desorbing the $F_X$ from the surface of the wafer 200 and being discharged from the process chamber 201. By etching each layer containing fluorine in a manner described above, it is possible to remove fluorine. By supplying the $O_3$ gas, the following reaction occurs between the $O_3$ gas and the AlOF on the surface of the wafer 200.

$$AlOF + O_3 \rightarrow Al_2O_3 + F_x$$

For example, the process conditions of the present step are as follows:

A supply flow rate of the $O_3$ gas: from 0.1 slm to 10 slm;

A supply flow rate of the $N_2$ gas (for each gas supply pipe): from 0 slm to 10 slm;

A supply time (time duration) of each gas: from 0.1 second to 200 seconds, preferably from 5 seconds to 150 seconds;

The process temperature: 200° C. or higher and less than 900° C., preferably from 300° C. to 800° C., more preferably from 300° C. to 450° C.; and The process pressure: from 150 Pa to 400 Pa, preferably from 200 Pa to 300 Pa.

<Purge Step: Step S220>

In the present step, the valve 243e is closed to stop the supply of the modification gas into the process chamber 201. In the present step, with the APC valve 244 of the exhaust pipe 231 open, the vacuum pump 246 vacuum-exhausts the inner atmosphere of the process chamber 201 to remove a substance such as a residual gas remaining on the wafer 200. Thereby, it is possible to remove the modification gas which did not react and reaction by-products remaining in the process chamber 201 out of the process chamber 201. In the present step, by maintaining the valves 243c and 243d open, the inert gas is continuously supplied into the process chamber 201. The inert gas acts as the purge gas in the present step, which improves an efficiency of removing the modification gas which did not react and the reaction by-products remaining in the process chamber 201 out of the process chamber 201 by removing the residual gas remaining on the wafer 200. Specifically, for example, the substance such as the $O_3$ gas (which did not react) and the $F_x$ (which is the reaction by-products) remaining in the process chamber 201 is removed from the process chamber 201.

<Third Halogen Element-Containing Gas Supply Step: Step S230>

Subsequently, the third halogen element-containing gas is supplied to the wafer 200 in the process chamber 201. Specifically, the valve 243b is opened such that the third halogen element-containing gas is supplied into the gas supply pipe 232b. A flow rate of the third halogen element-containing gas supplied into the gas supply pipe 232b is adjusted by the MFC 241b. Then, the third halogen element-containing gas whose flow rate is adjusted is supplied into the process chamber 201 through the nozzle 249b, and is exhausted through the exhaust pipe 231. In the present step, simultaneously with a supply of the third halogen element-containing gas, the valves 243c and 243d are opened such that the inert gas is supplied into the gas supply pipes 232c and 232d.

As the third halogen element-containing gas, for example, a gas containing the third halogen element (which is different from the first halogen element described above and which is the same as the second halogen element described above) may be used. As the gas containing the third halogen element, for example, the second halogen element-containing gas may be used. However, the third halogen element-containing gas may be different from the second halogen element-containing gas. The gas species (that is, the third halogen element-containing gas) used in the present step is selected in accordance with the process temperature.

Specifically, for example, when the $BCl_3$ gas is used as the third halogen element-containing gas (that is, when the third halogen element-containing gas is the same as the second halogen element-containing gas), by supplying the $BCl_3$ gas, the AlOF on the surface of the wafer 200 reacts with the $BCl_3$. Thereby, oxygen (O) is desorbed from the AlOF and substituted with chlorine (Cl). As a result, the AlOF formed on the wafer 200 is converted to the $AlCl_xF_y$ (which is volatile) and desorbed from the surface of the wafer 200. Further, oxygen desorbed from the AlOF combines with $BCl_x$ to generate $BOCl_x$. That is, the $AlCl_xF_y$ and the $BOCl_x$ are desorbed from the surface of the wafer 200 and discharged from the process chamber 201. Thereby, the residual fluorine is removed. By etching each layer containing fluorine in a manner described above, it is possible to remove fluorine. By supplying the $BCl_3$ gas, the following reaction occurs between the $BCl_3$ gas and the AlOF on the surface of the wafer 200.

$$AlOF+BCl_3 \rightarrow AlCl_xF_y+BOCl_x$$

For example, the process conditions in the present step may be set to be substantially the same conditions as in the step S130 described above.

<Purge Step: Step S240>

In the present step, the valve 243*b* is closed to stop the supply of the third halogen element-containing gas into the process chamber 201. In the present step, with the APC valve 244 of the exhaust pipe 231 open, the vacuum pump 246 vacuum-exhausts the inner atmosphere of the process chamber 201 to remove a substance such as a residual gas remaining on the wafer 200. Thereby, it is possible to remove the third halogen element-containing gas which did not react and reaction by-products remaining in the process chamber 201 out of the process chamber 201. In the present step, by maintaining the valves 243*c* and 243*d* open, the inert gas is continuously supplied into the process chamber 201. The inert gas acts as the purge gas in the present step, which improves an efficiency of removing the third halogen element-containing gas which did not react and the reaction by-products remaining in the process chamber 201 out of the process chamber 201 by removing the residual gas remaining on the wafer 200. Specifically, for example, the substance such as the $BCl_3$ gas (which did not react) and the $AlCl_xF_y$ and the $BOCl_x$ (which are the reaction by-products) remaining in the process chamber 201 is removed from the process chamber 201.

<Performing Second Cycle Second Predetermined Number of Times: Step S250>

By performing a second cycle wherein the steps S210 through S240 described above are performed a second predetermined number of times (m times, wherein m is an integer equal to or greater than 1), it is possible to process the wafer 200 by removing the first halogen element remaining on the wafer 200. That is, in the step S20, the modification gas supply step (step S210) and the third halogen element-containing gas supply step (step S230) are performed. When m is equal to or greater than 2, the modification gas supply step (step S210) and the third halogen element-containing gas supply step (step S230) may be alternately performed.

<After-Purge Step and Returning to Atmospheric Pressure Step>

After the residual first halogen element removing step S20 described above is completed, the inert gas is supplied into the process chamber 201 through each of the gas supply pipes 232*c* and 232*d*, and then is exhausted through the exhaust pipe 231. Thereby, the inner atmosphere of the process chamber 201 is purged with the inert gas. As a result, the substance such as the residual gas and the reaction by-products remaining in the process chamber 201 is removed from the process chamber 201 (after-purge step). Thereafter, the inner atmosphere of the process chamber 201 is replaced with the inert gas (substitution by inert gas), and the inner pressure of the process chamber 201 is returned to the normal pressure (atmospheric pressure) (returning to atmospheric pressure step).

<Boat Unloading Step and Wafer Discharging Step>

Thereafter, the seal cap 219 is lowered by the boat elevator 115 and the lower end of the reaction tube 203 is opened. Then, the boat 217 with the processed wafers 200 supported therein is unloaded (transferred) out of the reaction tube 203 through the lower end of the reaction tube 203 (boat unloading step). Then, the processed wafers 200 are discharged (transferred) from the boat 217 after the boat 217 is unloaded out of the reaction tube 203 (wafer discharging step).

(3) Effects According to Present Embodiment

According to the present embodiment, it is possible to obtain one or more of the following effects.

(a) It is possible to improve the device characteristics by removing the residual first halogen element by performing the atomic layer etching step S10.

(b) It is possible to etch the film with a good step coverage even when the film is formed on a surface of a structure whose aspect ratio is high.

(c) By performing the residual first halogen element removing step S20 separately from the atomic layer etching step S10, it is possible to shorten the process time. Thereby, it is possible to improve a throughput.

(d) It is possible to obtain effects described above when an oxide film other than the $Al_2O_3$ film is used, when the first halogen element-containing gas other than the HF gas is used, when the second halogen element-containing gas other than the $BCl_3$ gas is used, when the modification gas other than the $O_3$ gas is used, when the third halogen element-containing gas other than the $BCl_3$ gas is used, and when the inert gas other than the $N_2$ gas is used.

Second Embodiment of Present Disclosure

Figure 6:
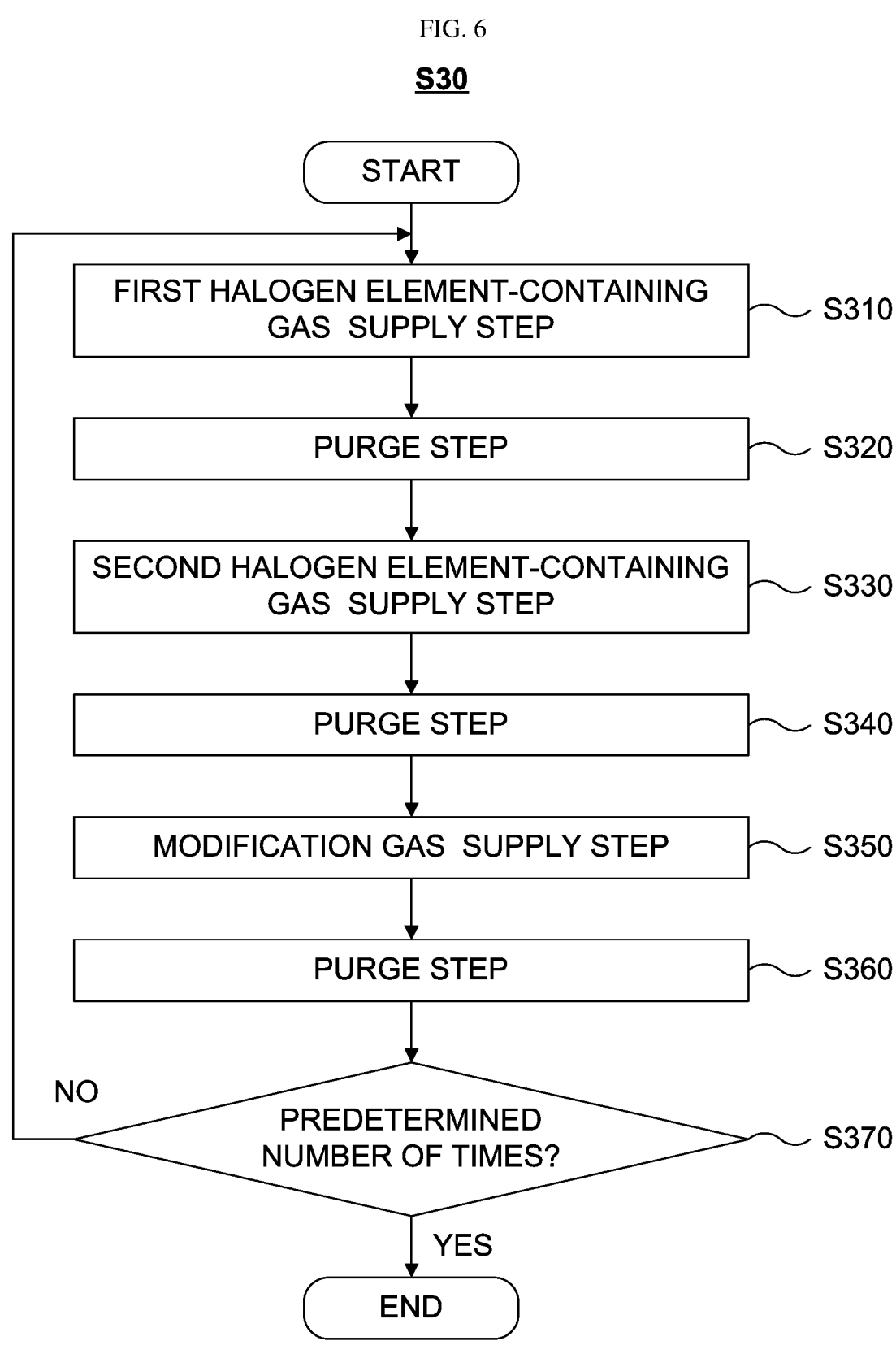
FIG. 6 is a flow chart schematically illustrating an atomic layer etching step according to a second embodiment of the present disclosure.

Subsequently, an atomic layer etching step S30 (which is a part of a substrate processing according to a second embodiment of the present disclosure) will be described with reference to FIG. 6.

According to the present embodiment, after steps S310, S320, S330 and S340 are performed in substantially the same manner as the steps S110 through S140 in the atomic layer etching step (step S10) described above, steps S350 and S360 are performed in substantially the same manner as the steps S210 and S220, respectively, in the residual first halogen element removing step (step S20) described above. Then, as a step S370, a third cycle of performing the steps S310 through S360 is performed a third predetermined number of times (p times, where p is an integer equal to or greater than 1). That is, the first halogen element is removed from each layer in each cycle (also referred to as "each etching") by supplying the modification gas. In a manner described above, it is possible to remove the first halogen element while the oxide film formed on the surface of the wafer 200 is etched. According to the present embodiment, it is possible to obtain substantially the same effects as in the first embodiment described above.

For example, after the steps S310 through S370 described above are performed, the residual first halogen element removing step S20 described above may further be performed. In such a case, it is possible to obtain substantially the same effects as in the first embodiment described above. In addition, it is possible to reduce an amount of the residual first halogen element.

Third Embodiment of Present Disclosure

Figure 7:
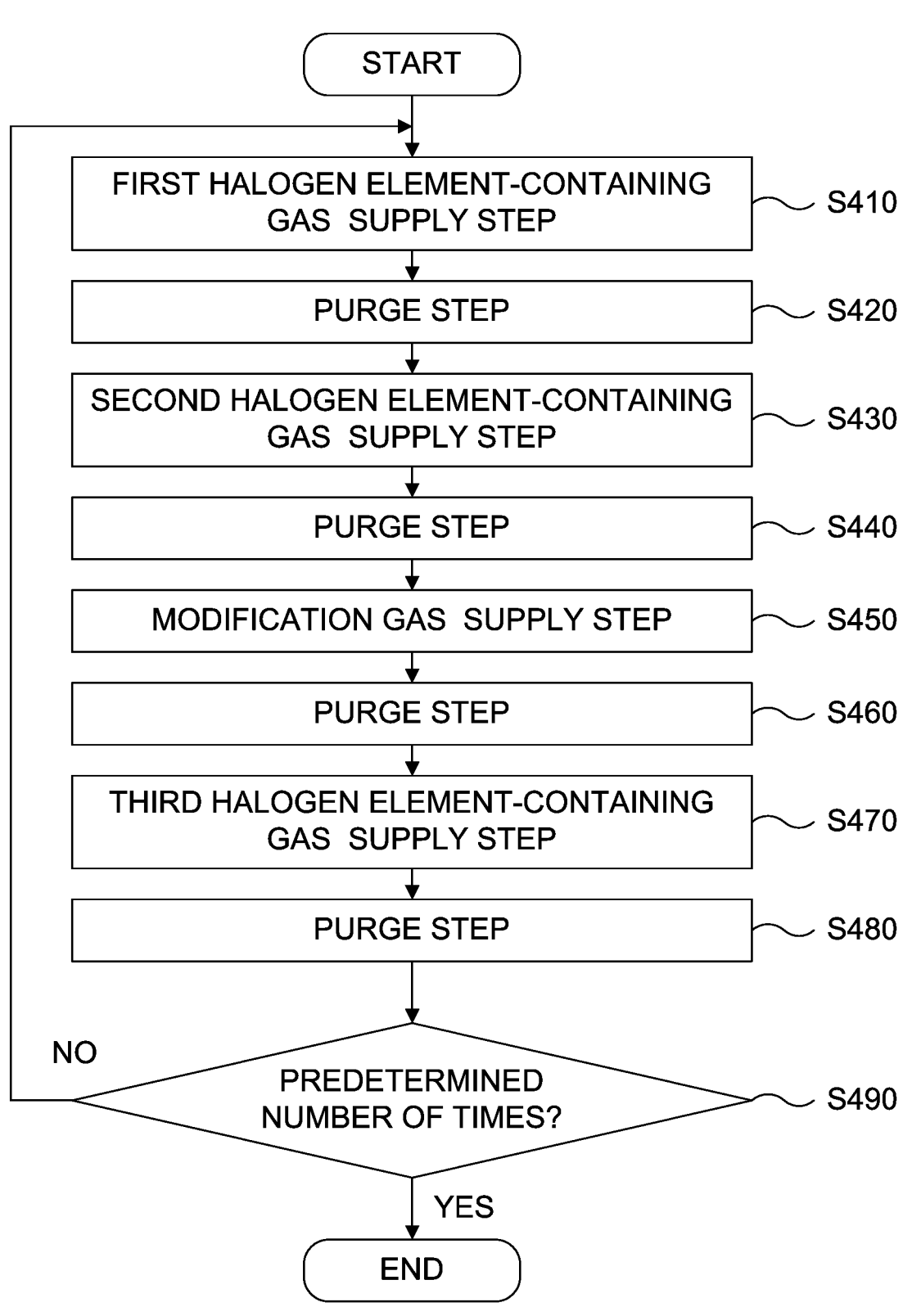
FIG. 7 is a flow chart schematically illustrating an atomic layer etching step according to a third embodiment of the present disclosure.

Subsequently, an atomic layer etching step S40 (which is a part of a substrate processing according to a third embodiment of the present disclosure) will be described with reference to FIG. 7.

According to the present embodiment, after steps S410, S420, S430 and S440 are performed in substantially the same manner as the steps S110 through S140 in the atomic layer etching step (step S10) described above, steps S450, S460, S470 and S480 are performed in substantially the same manner as the steps S210 through S240 in the residual first halogen element removing step (step S20) described above. Then, as a step S490, a fourth cycle of performing the steps S410 through S480 is performed a fourth predetermined number of times (q times, where q is an integer equal to or greater than 1). That is, the first halogen element is removed from each layer in each cycle (also referred to as "each etching") by supplying the modification gas and the third halogen element-containing gas. In a manner described above, it is possible to remove the first halogen element while the oxide film formed on the surface of the wafer 200 is etched. According to the present embodiment, it is possible to obtain substantially the same effects as in the first embodiment described above.

For example, after the steps S410 through S490 described above are performed, the residual first halogen element removing step S20 described above may further be performed. In such a case, it is possible to obtain substantially the same effects as in the first embodiment described above. In addition, it is possible to reduce the amount of the residual first halogen element.

Fourth Embodiment of Present Disclosure

According to the present embodiment, in the atomic layer etching step (step S10), an execution order of the first halogen element-containing gas supply step (step S110) and the second halogen element-containing gas supply step (step S130) is reversed. That is, a fifth cycle wherein the second halogen element-containing gas supply step (step S130), the purge step (step S140), the first halogen element-containing gas supply step (step S110) and the purge step (step S120) are performed in this order is performed a predetermined number of times. Specifically, for example, when the HF gas is used as the first halogen element-containing gas and the $BCl_3$ gas is used as the second halogen element-containing gas, by supplying the $BCl_3$ gas before the HF gas, the following reaction occurs between the $BCl_3$ gas and the $Al_2O_3$ on the surface of the wafer 200.

$$Al_2O_3 + 2BCl_3 \rightarrow 2AlCl_3 + B_2O_3$$

$$AlCl_3 + 2HF \rightarrow AlClF_2 + 2HCl$$

$$AlCl_3 + HF \rightarrow AlCl_2F + HCl$$

$$AlCl_3 + 3HF \rightarrow AlF_3 + HCl$$

By supplying the HF gas after supplying the $BCl_3$ gas, the following reactions occur on the wafer 200.

$$AlCl_3 + 2HF \rightarrow AlClF_2 + 2HCl$$

$$AlCl_3 + HF \rightarrow AlCl_2F + HCl$$

$$AlCl_3 + 3HF \rightarrow AlF_3 + HCl$$

In addition, the $B_2O_3$ which is non-volatilized may remain on the surface of the $Al_2O_3$. In such a case, the following reactions occur.

$$B_2O_3 + 6HF \rightarrow 2BF_3 + 3H_2O$$

In addition, a part of the wafer 200 is in a state where the $Al_2O_3$ is exposed. In such a case, the following reactions occur.

$$Al_2O_3 + HF \rightarrow AlOF + H_2O$$

That is, even when the $AlCl_xF_y$, the $H_2O$ and the HCl are desorbed from the surface of the wafer 200, the $AlF_3$ and the AlOF are difficult to be desorbed. As a result, fluorine may remain.

As described above, by performing the residual first halogen element removing step (step S20) on the wafer 200 after the wafer 200 is etched by using the first halogen element-containing gas, it is possible to remove the first halogen element. As a result, it is possible to obtain substantially the same effects as in the first embodiment described above.

OTHER EMBODIMENT OF PRESENT DISCLOSURE

While the technique of the present disclosure is described in detail by way of the embodiments described above, the technique of the present disclosure is not limited thereto. The technique of the present disclosure may be modified in various ways without departing from the scope thereof. For example, the embodiments described above are described by way of an example in which the residual first halogen element removing step S20 is performed after the atomic layer etching step S10. However, the technique of the present disclosure is not limited thereto. For example, the residual first halogen element removing step S20 may be performed before the atomic layer etching step S10.

For example, the embodiments described above are described by way of an example in which the modification gas supply step S210 and the third halogen element-containing gas supply step S230 are alternately performed in the residual first halogen element removing step S20. However, the technique of the present disclosure is not limited thereto. For example, a timing at which the modification gas supply step S210 and the third halogen element-containing gas supply step S230 are performed in parallel may be provided. In particular, when the hydrogen-containing gas is used as the modification gas, it is preferable to provide the timing at which the modification gas supply step S210 and the third halogen element-containing gas supply step S230 are performed in parallel.

For example, the embodiments described above are described by way of an example in which the atomic layer etching step S10 and the residual first halogen element removing step S20 are performed continuously (that is, "in situ") in the same process furnace. However, the technique of the present disclosure is not limited thereto. For example, the atomic layer etching step S10 and the residual first halogen element removing step S20 may performed in different process furnaces (that is, "ex situ").

It is preferable that recipes used in the substrate processing are prepared individually in accordance with contents of the substrate processing and stored in the memory 121c via an electric communication line or the external memory 123. When starting the substrate processing, it is preferable that the CPU 121a selects an appropriate recipe among the recipes stored in the memory 121c in accordance with the contents of the substrate processing. Thus, various films of different composition ratios, qualities and thicknesses can be formed in a reproducible manner and in a universal manner by using a single substrate processing apparatus (that is, the substrate processing apparatus according to the embodiments described above). In addition, since a burden on an operating personnel of the substrate processing apparatus can be reduced, the substrate processing can be performed quickly while avoiding a malfunction of the substrate processing apparatus.

The recipe described above is not limited to creating a new recipe. For example, the recipe may be prepared by changing an existing recipe stored (installed) in the substrate processing apparatus in advance. When changing the existing recipe to the new recipe, the new recipe may be installed in the substrate processing apparatus via the electric communication line or the recording medium in which the new recipe is stored. Further, the existing recipe already stored in the substrate processing apparatus may be directly changed to the new recipe by operating the input/output device 122 of the substrate processing apparatus.

For example, the embodiment described above are described by way of an example in which a batch type substrate processing apparatus capable of simultaneously processing a plurality of substrates is used to form the film. However, the technique of the present disclosure is not limited thereto. For example, the technique of the present disclosure may be preferably applied when a single wafer type substrate processing apparatus capable of processing one or several substrates at once is used to form the film. For example, the embodiment described above are described by way of an example in which a substrate processing apparatus including a hot wall type process furnace is used to form the film. However, the technique of the present disclosure is not limited thereto. For example, the technique of the present disclosure may be preferably applied when a substrate processing apparatus including a cold wall type process furnace is used to form the film.

The process procedure and the process conditions of each process using the substrate processing apparatuses exemplified above may be substantially the same as those of the embodiments described above. Even in such a case, it is possible to obtain substantially the same effects as in the embodiments described above.

Further, the embodiment described above may be appropriately combined. The process procedure and the process conditions of each combination thereof may be substantially the same as those of the embodiments described above.

According to some embodiments of the present disclosure, it is possible to improve the device characteristics.

What is claimed is:

1. A substrate processing method comprising:
(A) etching a metal oxide film on a substrate by performing a first cycle a first predetermined number of times, wherein the first cycle comprises:
  (a) supplying a first halogen element-containing gas to the substrate; and
  (b) supplying a second halogen element-containing gas to the substrate; and
(B) removing a first halogen element on the substrate by performing a second cycle a second predetermined number of times after performing (A), wherein the second cycle comprises:
  (c) supplying a modification gas containing at least one of oxygen or hydrogen to the substrate; and (d) supplying a third halogen element-containing gas to the substrate.

2. The substrate processing method of claim 1, wherein (B) is performed after (A).

3. The substrate processing method of claim 1, wherein (a) and (b) are alternately performed in (A).

4. The substrate processing method of claim 1, wherein (c) and (d) are alternately performed in (B).

5. The substrate processing method of claim 1, wherein a timing at which (c) and (d) are performed in parallel is provided in (B).

6. The substrate processing method of claim 1, wherein the first halogen element contained in the first halogen element-containing gas is different from a second halogen element contained in the second halogen element-containing gas.

7. The substrate processing method of claim 1, wherein the first halogen element contained in the first halogen element-containing gas comprises fluorine.

8. The substrate processing method of claim 1, wherein a second halogen element contained in the second halogen element-containing gas comprises chlorine.

9. The substrate processing method of claim 1, wherein the first halogen element-containing gas comprises a hydrogen compound.

10. The substrate processing method of claim 1, wherein the second halogen element-containing gas comprises a compound of a Group 13 element or a compound of a Group 15 element.

11. The substrate processing method of claim 1, wherein a third halogen element contained in the third halogen element-containing gas is different from the first halogen element contained in the first halogen element-containing gas.

12. The substrate processing method of claim 1, wherein a third halogen element contained in the third halogen element-containing gas is same as a second halogen element contained in the second halogen element-containing gas.

13. The substrate processing method of claim 1, wherein, in (B), a second halogen element contained in the second halogen element-containing gas remaining on the substrate in (A) is removed.

14. A method of manufacturing a semiconductor device, comprising the substrate processing method of claim 1.

15. The substrate processing method of claim 1, wherein a first material is formed on the surface in (a), the first material containing metal and oxygen contained in the metal oxide film and the first halogen element.

16. The substrate processing method of claim 15, wherein a part of the first material is converted into a second material and a part of the first material remains on the substrate in (b), the second material containing metal, the first halogen element and a second halogen element.

17. The substrate processing method of claim 16, wherein the second halogen element comprises an element selected from the group consisting of boron, carbon, sulfur, aluminum, gallium and indium, and
wherein a compound of the first halogen element and the element selected from the group consisting of boron, carbon, sulfur, aluminum, gallium and indium is generated in (b).

18. The substrate processing method of claim 16, wherein, in (c), the first halogen element is desorbed from the first material remaining on the substrate.

* * * * *